United States Patent [19]
Doluca

[11] Patent Number: 4,667,164
[45] Date of Patent: May 19, 1987

[54] FREQUENCY RESPONSE AMPLIFIER

[75] Inventor: Tunc Doluca, Santa Clara, Calif.

[73] Assignee: Intersil, Inc., Cupertino, Calif.

[21] Appl. No.: 669,119

[22] Filed: Nov. 7, 1984

[51] Int. Cl.[4] .......................... H03F 3/45; H03F 3/16
[52] U.S. Cl. .................................. 330/253; 330/277;
330/300; 330/307
[58] Field of Search ............... 330/253, 264, 277, 300,
330/307, 311, 257, 288

[56] References Cited
U.S. PATENT DOCUMENTS

| | | | |
|---|---|---|---|
| 4,334,196 | 6/1982 | Schade, Jr. | 330/253 |
| 4,481,478 | 11/1984 | Flink et al. | 330/253 |
| 4,511,854 | 4/1985 | Kishida | 330/300 X |

Primary Examiner—Eugene R. LaRoche
Assistant Examiner—Steven J. Mottola
Attorney, Agent, or Firm—Stanley C. Corwin; Mark Mollon

[57] ABSTRACT

An operational amplifier or comparator is provided in which internal parasitic capacitances are buffered to increase the gain bandwidth product of the amplifier.

3 Claims, 4 Drawing Figures 4,667,164

FREQUENCY RESPONSE AMPLIFIER

BACKGROUND OF THE INVENTION

1. Field of the Invention

The present invention relates to amplifiers, and more particularly, to circuits for improving the gain bandwidth product of amplifiers.

2. Description of the Prior Art

The bandwidth of an amplifier can be defined as the difference between the maximum and minimum input frequencies at which a reasonably non-distorted output signal can be obtained. The gain of the amplifier is a measure of the amplification of the output signal relative to the input signal to the amplifier. The product of these two parameters defines a third parameter often referred to as the gain bandwidth product. Because the gain bandwidth product (GBWP) is often a constant for a particular amplifier, increasing the gain of the amplifier typically causes a corresponding reduction in the bandwidth of the amplifier. Accordingly, it would be desirable to increase the GBWP of an amplifier in order to increase the gain or bandwidth without having an adverse effect on the other factor.

The GBWP of a typical complementary metal oxide semiconductor field-effect transistor (CMOS) two-stage operational amplifier (FIG. 1) is usually limited by internal capacitances of various transistors within the operational amplifier circuit. These capacitive loads create "poles" in the transfer function of the amplifier, each of which causes an attenuation and phase shift in the output signal at a particular "pole frequency". Due to various design constraints, the pole frequencies of one or more of the transfer function poles is often sufficiently low to adversely affect the GBWP of the amplifier.

SUMMARY OF THE INVENTION

It is an object of the present invention to provide an operational amplifier having an improved gain bandwidth product (GBWP).

It is a further object to improve the slew rate of operational amplifiers.

These and other objects and advantages are achieved in an operational amplifier in which internal parasitic capacitive loads are buffered. As a consequence, the pole frequencies associated with the parasitic capacitive loads are moved to significantly higher frequenices thereby improving the gain bandwidth product and slew rate over many previous operational amplifiers.

In the illustrated embodiment, an emitter follower circuit buffers the output of an input transistor of a two-stage operational amplifier to the gates of a current mirror transistor pair. The increased gain of the emitter follower circuit has been found to shift the pole frequency associated with the parasitic capacitance of the transistors of the current mirror pair.

In another aspect of the present invention, a second emitter follower circuit buffers the output of an input stage to the input of an amplification stage of the two-stage amplifier. This arrangement has also been found to shift the pole frequency of a parasitic capacitance of a transistor of the amplifier stage to a higher frequency with a corresponding favorable effect on the GBWP of the amplifier.

DETAILED DESCRIPTION OF THE DRAWINGS

Figures 1, 2:
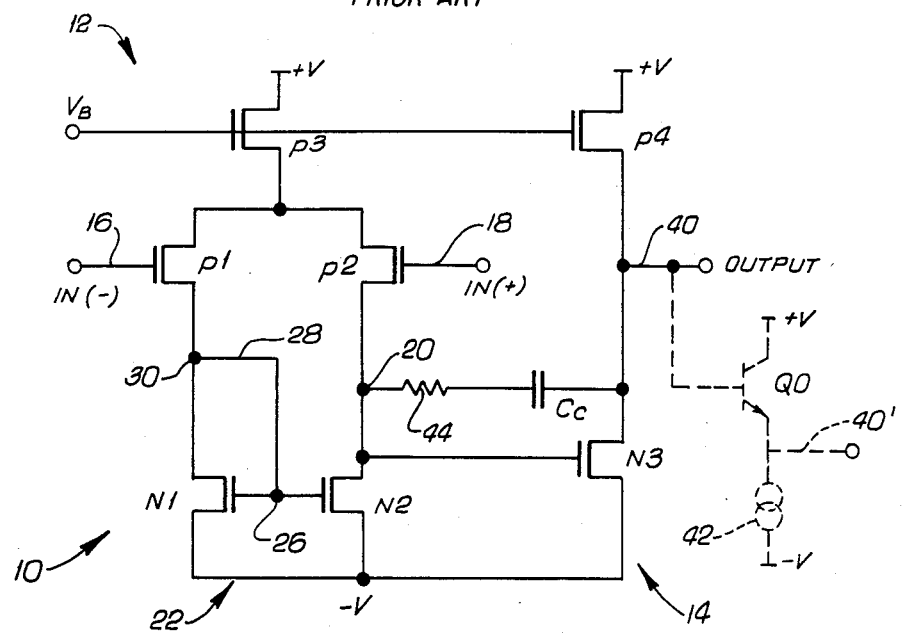
FIG. 1 is a schematic diagram of a prior art two-stage CMOS operational amplifier.
FIG. 2 is a schematic diagram of the amplifier of FIG. 1 illustrating various internal parasitic capacitances of elements of the amplifier of FIG. 1.

FIG. 1 shows a prior art CMOS two-stage integrated circuit operational amplifier (or comparator) which is indicated generally at 10. The first stage of the amplifier 10 is a differential input gain stage 12 and is followed by the second stage which is a single-ended common source amplification stage 14. The differential input stage 12 has an inverting input 16 and a non-inverting input 18. The difference between first and second voltages applied to the amplifier inputs 16 and 18, respectively, is amplified at an output 20 of the differential input stage 12.

The input stage 12 has a first input leg 22 which includes a p-channel input transistor P1 having a gate electrode coupled to the inverting input 16 of the input stage 12. The leg 22 further includes an n-channel load transistor N1 coupled to the output 30 of the input transistor P1. A second leg 24 similarly includes a p-channel input transistor P2 having a gate electrode coupled to the non-inverting input 18, and an n-channel load transistor N2 coupled to the output of the input transistor P2. A third p-channel transistor P3 provides a constant bias current to the two differential input legs 22 and 24 of the input stage 12.

The input transistors P1 and P2 convert the voltage difference applied to their gate electrodes to an output drain current difference. As shown in FIG. 1, the load transistors N1 and N2 are configured as current mirrors so that the transistors N1 and N2 convert the output drain current difference of the input transistors P1 and P2 to a voltage difference signal at output 20. Specifically, the gates of the load transistors N1 and N2 are coupled to a common node 26 which is coupled by an interconnection 28 to the output 30 of the load transistor N1.

The voltage signal at output 20 is applied to the gate electrode of an n-channel input transistor N3 of the amplifier second stage 14. The input transistor N3 operates as a common source amplifier biased by a p-channel transistor P4. The coupled outputs of the second stage transistors P4 and N3 provide an output of the amplifier 10 as indicated at 40. Optionally, an npn bipolar transistor Q0 and a constant current source 42 can be added to the output 40 to buffer the output as indicated in phantom, providing a buffered output at 40'.

Various circuit elements such as the transistors of the amplifier 10 have parasitic capacitances associated with them which create poles in the transfer function of the amplifier 10. Because these poles cause phase shifts as well as attenuation of the output, the parasitic capacitances can lead to unstable operation where a feedback loop is utilized. In order to increase the stability of the operation of the amplifier 10, a series-connected resistor 44 and compensation capacitor $C_c$ are coupled between the amplifier output 40 and the first stage output at 20. The capacitance of the capacitor $C_c$ is chosen sufficiently large so that the pole frequency of the pole created by the capacitor $C_c$ is lower than the pole frequencies of the parasitic capacitances. Consequently, the pole created by the compensation capacitor $C_c$ dominates the effect of the parasitic capacitances to increase the stability of the amplifier. This circuit design technique is often referred to as dominant pole compensation.

Although the compensation capacitor $C_c$ inhibits the destabilizing effect of the parasitic capacitances, several of these parasitic capacitances nonetheless limit the gain bandwidth product (GBWP) of the amplifier. The amplifier 10 of FIG. 1 typically has a GBWP of 1.5 to 2 megahertz.

FIG. 2 is an AC model of the amplifier 10 of FIG. 1, in which various parasitic capacitances have been represented as capacitors drawn in phantom and coupled to AC ground. One such parasitic capacitance indicated at C1 is caused by the capacitance of the source regions of the input transistors P1 and P2 and the drain region of the biasing transistor P3, relative to the substrate of the amplifier. In FIG. 2, the biasing transistors P3 and P4 are represented as constant current sources 34 and 38, respectively.

The pole frequency of the pole created by the parasitic capacitance C1 is directly related to the transconductances of the first stage input transistors P1 and P2. Assuming the transconductances of the input transistors P1 and P2 to be substantially equal, the pole frequency $F_{TP}$ for the pole (often referred to as the "tail pole") of the capacitance C1 is set forth in equation (1) below:

$$\frac{1}{2\pi F_{TP}} = \frac{C1}{2[gm(P1)]} \quad (1)$$

where gm(P1) represents the transconductance of the input transistor P1 (or P2). Because the transconductance of the input transistors P1 and P2 is relatively high, the pole frequency FTP of the tail pole is correspondingly high so that the tail pole does not significantly affect the gain bandwidth product (GPWP) of the amplifier.

Another parasitic capacitance C2 is caused by the capacitance of the drain regions of the input leg transistors P1 and N1 relative to the substrate. The gates of the input stage load transistors N1 and N2 also have capacitances associated with them, and these gate capacitances are collectively represented by the capacitor C3 of FIG. 2.

The parasitic capacitances C2 and C3 create a pole referred to as a "mirror pole" which has a pole frequency $F_{MP}$ as set forth in equation (2) below:

$$\frac{1}{2\pi F_{MP}} = \frac{C2 + C3}{gm(N1)} \quad (2)$$

where the gate capacitances of the first stage load transistors N1 and N2 are approximately equal so that the capacitance of C3 is equal to twice the gate capacitance of either N1 or N2. As indicated above, the pole frequency $F_{MP}$ of the mirror pole associated with C2 and C3 is directly related to the transconductance of the load transistor N1.

In the amplifier 10 of FIGS. 1 and 2, the transconductances of the load transistors N1 and N2 should be relatively small due to various design constraints including the minimization of noise and DC offset. As seen from equation (2) above, these constraints cause the mirror pole frequency $F_{MP}$ to be correspondingly low, thereby resulting in the mirror pole having a significant effect on the GBWP of the amplifier.

The transfer function of the amplifier 10 also has a "split" pole resulting from the load capacitance on the second stage 14 in addition to the load capacitance on the first stage 12. The second stage load capacitance is caused by the drain diffusion region capacitance of the second stage transistors N3 and P4 as represented by the capacitor C4, and the capacitance of any load coupled to the output 40 of the amplifier 10. This load capacitance is represented by the capacitor CL in FIG. 2. The load capacitance of the first stage 12 is provided by the capacitance of the drain diffusion regions of the transistors P2 and N2, which is represented by the capacitor C5, and the gate capacitance C6 of the second stage input transistor N3.

The poles created by the first stage load capacitances C5 and C6 on the one hand and the second stage load capacitances C4 and CL on the other hand, are, absent the compensation capacitor $C_c$, fairly close together due to the relatively large output impedances of the respective driving transistors, N2 and N3. However, the addition of the compensation capacitor $C_c$ moves the pole frequency of the first stage load capacitance to a much lower frequency due to the Miller effect of the gain of the second stage input transistor N3 on the compensation capacitor $C_c$. On the other hand, the compensation capacitor $C_c$ acts like a short at high frequencies so that the gate of the second stage input transistor N3 is effectively shorted to its gate. Consequently, the output impedance of the input transistor N3 is lower at the higher frequencies so that the pole frequency of the second stage load capacitance is correspondingly moved to a higher frequency. In this manner, the poles of the first and second stage load capacitances are split. Although the split pole frequency $F_{SP}$ of the second stage load capacitances is moved to a higher frequency, it has been found that the second stage load capacitance pole still has a significant effect on the amplifier GBWP as shown below:

$$\frac{1}{2\pi F_{SP}} = \frac{CL + C4 + C5 + C6}{gm(N3)} \quad (3)$$

where the transconductance of the second stage input transistor is represented by gm(N3).

If the load capacitance CL is buffered by a buffer amplifer as represented by the transistor QO of FIG. 1, the split pole frequency $F_{SP}$ is given by the following relationship:

$$\frac{1}{2\pi F_{SP}} = \frac{C4 + C5 + C6}{gm(N3)} \quad (4)$$

Figure 3:
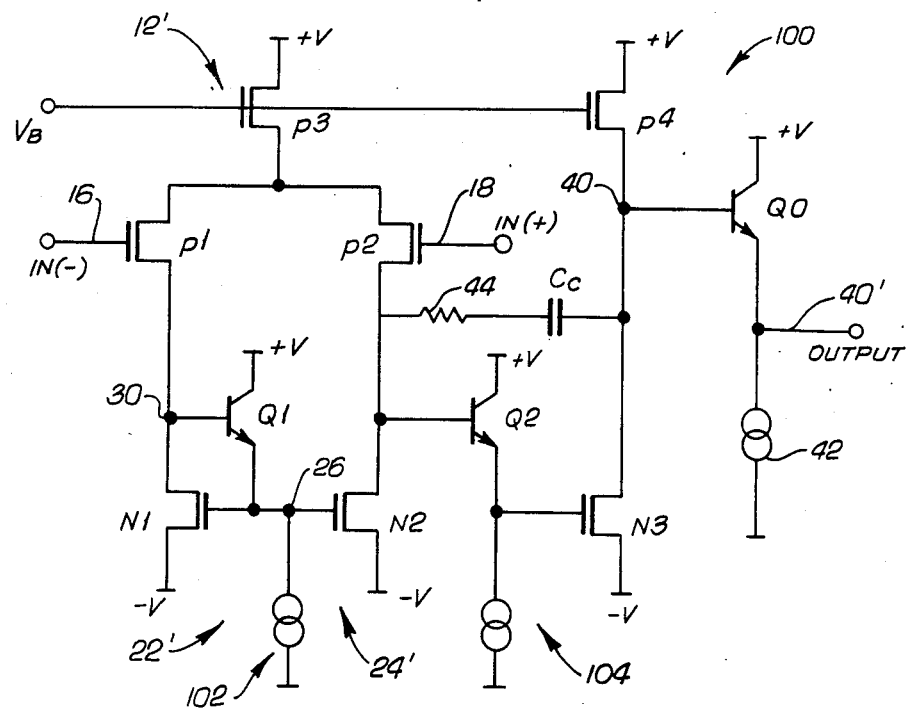
FIG. 3 is a schematic diagram of a CMOS two-stage operational amplifier in accordance with a preferred embodiment of the present invention.

In accordance with the present invention, the gain bandwidth product (GBWP) of the amplifier shown in FIGS. 1 and 2 can be significantly improved by pushing both the split and the mirror poles to higher frequencies. FIG. 3 illustrates an amplifier 100 which is a preferred embodiment of the present invention. Those elements in common with the amplifier 10 of FIGS. 1 and 2 have been designated with like numerals.

Like the amplifier 10 of FIGS. 1 and 2, the amplifier 100 includes an input stage 12' having a first differential input leg 22' and a second differential input leg 24'. However, instead of the interconnection 28 coupling the output 30 of the load transistor N1 to the node 26 of the gates of the load transistors N1 and N2, the amplifier 100 has an npn bipolar transistor Q1 which drives the gates of the load transistors N1 and N2. As shown in FIG. 3, the transistor Q1 is configured as an emitter follower stage or amplifier with the emitter of the transistor Q1 coupled to the node 26 at the gates of the transistors N1 and N2. A constant current source 102 also coupled to the node 26 biases the transistor Q1.

It has been found that the provision of the transistor Q1 to drive the gates of the load transistors N1 and N2 typically increases the pole frequency of the mirror pole by a factor of 2 to 3. Although the transistor Q1 introduces a new pole, this new pole is at a very high frequency due to the higher gain or transconductance typical of bipolar transistors and is therefore not particularly significant. The pole frequency $F_Q$ of the new pole is set forth below:

$$\frac{1}{2\pi F_{Q1}} = \frac{C3}{gm(Q1)} \quad (5)$$

where gm(Q1), the transconductance of the transistor Q1, is typically 10 times the transconductance gm(N1) of the load transistor N1.

Accordingly, the effect of the gate capacitance C3 is substantially reduced because the gate capacitances C3 are buffered by the transistor Q1 rather than driven by the load transistor N1. The pole frequency $F_{MP}$ of the mirror pole can now be approximated as:

$$\frac{1}{2\pi F_{MP}} = \frac{C2}{gm(N1)} \quad (6)$$

instead of equation (2) above. Thus, where the parasitic capacitance C3 is approximately 2 to 3 times larger than the parasitic capacitance C2, it is seen that the mirror pole frequency $F_{MP}$ is correspondingly 2 to 3 times higher as a result of the addition of the transistor Q1.

The pole frequency $F_{SP}$ of the split pole may also be pushed to substantially higher frequencies. In accordance with the present invention, a second npn bipolar transistor Q2 has been added which buffers the output 20 of the load transistor N2 to the gate of the second stage 14' input transistor N3. Like the transistor Q1 of the differential input stage 12', the transistor Q2 is configured as an emitter follower with the emitter of the transistor Q2 coupled to the gate of the input transistor N3 and a constant current source 104.

The bipolar transistor Q2 drives the parasitic capacitance C6 arising from the gate capacitance of the transistor N3, thereby reducing the effective capacitance of that node. Specifically, the pole frequency $F_{Q2}$ for the gate capacitance of the input transistor N4 is set forth below:

$$\frac{1}{2\pi F_{Q2}} = \frac{C6}{gm(Q2)} \quad (7)$$

where the transconductance gm(Q2) of the transistor Q2 is typically 10 times greater than the transconductance gm(N3) of the second stage input transistor N3. Consequently, the effect of the gate capacitance C6 on the split pole frequency is substantially reduced so that the split pole frequency $F_{SP}$ can be represented as follows:

$$\frac{1}{2\pi F_{SP}} = \frac{C4 + C5}{gm(N3)} \quad (8)$$

instead of by equation of (4) above.

As seen above, the split pole frequency $F_{SP}$ is significantly increased. Furthermore, the transistor Q2 voltage shifts the output of the differential input stage 12' to drive the second stage input transistor N3.

The above described amplifier 100 achieves a wider bandwidth and therefore a larger gain bandwidth product by buffering internal capacitive loads with emitter follower stages. In particular, the current mirror and split poles are moved to two or three times higher frequencies in the illustrated embodiment, improving the gain bandwidth product and slew rate by a factor of two over many prior art two-stage CMOS amplifier/comparators.

The transistors Q1 and Q2 added to the circuit of FIG. 1 operate at the same current density to maintain balanced operation on the input stage 12'. Furthermore, the addition of the emitter follower amplifiers Q1 and Q2 does not significantly degrade the noise performance or the DC accuracy of the amplifier. It is noted that the negative common mode range is somewhat reduced however.

Figure 4:
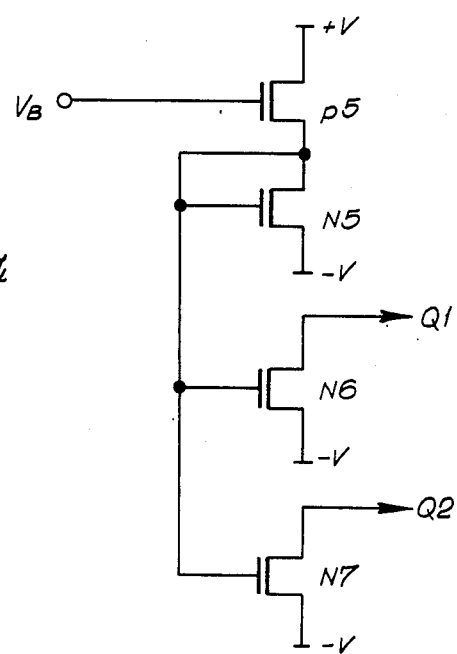
FIG. 4 is a schematic diagram of constant current sources for the amplifier of FIG. 3.

As previously mentioned, the bipolar transistors Q1 and Q2 are configured as emitter follower stages and are biased by the constant current sources 102 and 104 respectively. FIG. 4 illustrates a circuit for implementing the constant sources of 102 and 104 of FIG. 3.

As shown therein, the gate of a p-channel transistor P5 similar to the constant current source transistors P3 and P4 of FIG. 3, is coupled to the biasing voltage $V_B$ with the source of transistor P5 coupled to the biasing voltage V+. The drain of the transistor P5 is coupled to a diode-connected n-channel transistor N5, the source of which is coupled to the biasing voltage V−. The gate of the transistor N5 is coupled to the gates of two additional n-channel transistors N6 and N7. The drains of the n-channel transistors N6 and N7 are coupled to the emitters of the transistors Q1 and Q2, respectively, with the sources of the transistors N6 and N7 coupled to the negative biasing voltage V−.

In operation, the voltage induced on the gate of the n-channel transistor N5 by the p-channel transistor P5 is applied to the gates of the constant current source transistors N6 and N7 producing a constant current through each bipolar transistor. These currents provide the biasing currents for the transistors Q1 and Q2 as previously described.

In the illustrated embodiment, the entire amplifier circuit 100 is fabricated as a monolithic integrated circuit. An amplifier in accordance with the illustrated embodiment is well suited for fabrication with a "P-well" process where vertical substrate npn bipolar transistors are readily available. It should be noted that an "N-well" process may also be used by substituting pnp transistors for the npn transistors shown and changing all other transistor types in the circuit.

It will, of course, be understood that other modifications of the present invention, in its various aspects, will be apparent to those skilled in the art, some being apparent only after study and others being merely matters of routine electronic design. For example, MOS transistors can be used as source followers in place of the bipolar emitter follower transistors shown. Furthermore, it is recognized that the present invention should not be restricted to common source type amplifiers but can also be applied to amplifiers cascoded to increase gain, for example. Other embodiments are also possible with their specific designs dependent upon the particular application. As such, the scope of the invention should not be limited to the particular embodiment herein described but should be defined only by the appended claims and equivalents thereof.

I claim:

1. In an integrated CMOS amplifier circuit which includes a MOS transistor having a gate and further includes a CMOS differential amplifier comprised of insulated gate field-effect transistors and having an internal output providing a signal to the MOS transistor gate, said transistor gate having a parasitic capacitance associated therewith and said transistor being configured within the integrated amplifier circuit such that the gate capacitance creates a pole in the transfer function of the integrated amplifier circuit, the improvement comprising:

bipolar transistor buffer means for coupling the differential amplifier internal output to the MOS transistor gate to amplify the signal to the MOS transistor gate so that the pole frequency of the pole associated with transistor gate capacitance is increased.

2. The circuit of claim 1 wherein the bipolar transistor buffer means comprises an emitter follower stage which includes a bipolar transistor and a constant current source coupled to the emitter of the transistor for biasing the bipolar transistor.

3. A CMOS amplifier comprising:

a differential input stage having first and second legs, said first leg comprising a first MOS input transistor and a first MOS load transistor coupled to the output of the first MOS input transistor, said second leg comprising a second MOS input transistor and a second MOS load transistor coupled to the output of the second MOS input transistor, said first and second load transistors having gates;

a bipolar transistor having a base coupled to the output of the first load transistor and an emitter coupled to the gates of the first and second load transistors;

a constant current source coupled to the emitter of the bipolar transistor for biasing the bipolar transistor;

a second stage which includes a third MOS input transistor having an output and a gate;

a second bipolar transistor having a base coupled to the output of the second MOS load transistor and an emitter coupled to the gate of the third MOS input transistor; and a constant current source coupled to the emitter of the second bipolar transistor for biasing the second bipolar transistor.

* * * * *